United States Patent [19]

Morrison et al.

[11] 4,331,934

[45] May 25, 1982

[54] CERENKOV SUBMILLIMETER ELECTROMAGNETIC WAVE OSCILLATOR

[75] Inventors: Clyde A. Morrison, Wheaton; Richard P. Leavitt, Berwyn Heights, both of Md.

[73] Assignee: The United States of America as represented by the Secretary of the Army, Washington, D.C.

[21] Appl. No.: 89,051

[22] Filed: Oct. 29, 1979

[51] Int. Cl.$^{3}$ .......................... H01J 25/00; H03B 9/01

[52] U.S. Cl. ........................................ 331/79; 315/3.5; 315/39.3

[58] Field of Search .................................... 331/79-82, 331/86, 88, 90, 91; 330/5, 43; 315/3.5, 4, 5, 39.3; 250/493-495

[56] References Cited

U.S. PATENT DOCUMENTS

| | | | |
|---|---|---|---|
| 2,768,297 | 10/1956 | Brück et al. | 331/82 X |
| 3,835,407 | 9/1974 | Yariv et al. | 330/5 |
| 3,860,880 | 1/1975 | Yariv et al. | 331/82 X |
| 4,122,372 | 10/1978 | Walsh | 331/79 X |

OTHER PUBLICATIONS

Marshall et al., "Generation of Coherent Cerenkov Radiation with an Intense Relativistic Electron Beam", The Physics of Fluids, vol. 20, Apr. 1977, pp. 709-710.

*Primary Examiner*—Siegfried H. Grimm
*Attorney, Agent, or Firm*—Nathan Edelberg; Robert P. Gibson; Saul Elbaum

[57] ABSTRACT

The device of the invention comprises a body of dielectric material having a metallic surface on one portion thereof. An electron beam is passed adjacent a second portion of the dielectric body in order to generate electromagnetic radiation in the dielectric. A feedback loop is provided to improve the coherence of the radiation output.

4 Claims, 2 Drawing Figures

CERENKOV SUBMILLIMETER ELECTROMAGNETIC WAVE OSCILLATOR

RIGHTS OF THE GOVERNMENT

The invention described herein may be manufactured, used and licensed by or for the U.S. Government for governmental purposes without the payment to us of any royalty thereon.

BACKGROUND OF THE INVENTION

Intense coherent sources of electromagnetic waves at near-millimeter wavelengths are very scarce and expensive. Accordingly, it is an object of this invention to provide a coherent wave oscillator which is simple, reliable and inexpensive to manufacture.

SUMMARY OF THE INVENTION

The device of the invention comprises means to direct an electron beam adjacent to the surface of a dielectric body. As is well known, if the veocity of the electron beam is such that $V > c/\sqrt{\epsilon}$ (c=speed of light in a vacuum), then the beam will generate an electromagnetic wave which propagates through the dielectric body. The phase velocity of the wave in the dielectric in the direction of the electron beam will be approximately the velocity of the beam. It has been discovered that if a certain amount of the electromagnetic energy flowing through the dielectric is removed and fed back to the input portion of the dielectric, the entire system can be made to act like a ring resonator. This feedback can be adjusted so as to be selective to a particular mode of propagation, thus discriminating against unwanted modes which contribute to the noise level of the device. A feedback loop is therefore provided to improve the coherence of the output of the wave generator.

DESCRIPTION OF THE PREFERRED EMBODIMENT

Figure 1:
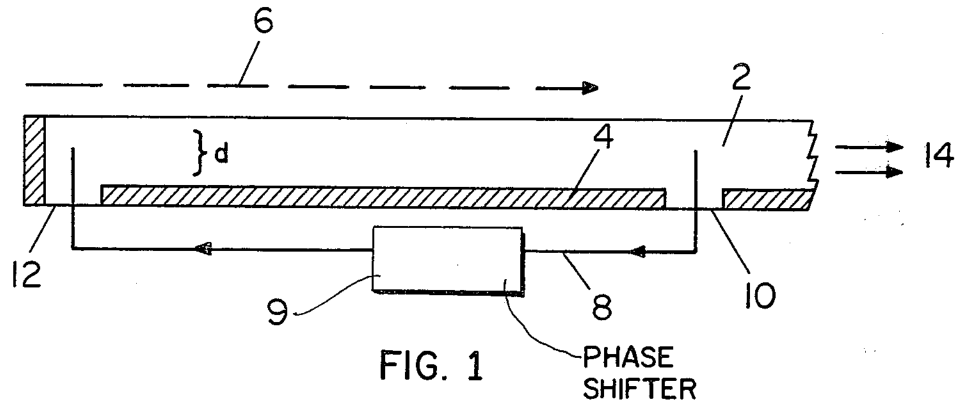
FIG. 1 illustrates an exemplary embodiment of the invention.

FIG. 1 illustrates an embodiment of the invention incorporating the essential elements thereof. It is understood that these elements are generally situated in an environment which provides a vacuum within which the device may operate.

The wave oscillator of the present invention comprises a slab 2 of dielectric material of thickness d. The slab is backed by a metallic layer 4. An electron beam is passed adjacent the surface of the dielectric opposite the metallic layer 4, thus generating an electromagnetic wave which propagates through the dielectric, as shown by arrows 14. Openings or gaps 10 and 12 are provided in the metallic layer 4. The opening 10 is located on the slab in an area which may be generally designated as an output portion for electromagnetic radiation. The opening 12, located nearer the source of the electron beam, is located in an area which may be generally considered to be an input portion. Feedback loop 8 extends from the opening 10 to the opening 12, and comprises phase shifter 9.

As noted above, passage of the beam 6 near the dielectric 2 will generate electromagnetic waves in the dielectric. The velocity of the wave in the dielectric in the direction of the electron beam will be approximately the velocity of the electron beam. The presence of metal plate 4 causes only certain modes to propagate in the dielectric. The thinner the dielectric the higher the frequency of the mode guided by the dielectric plate. Therefore, for a given velocity of the electron beam, only modes with frequency higher than a certain lower limit will propagate. This phenomenon is well known to those skilled in microwave electronics.

The feedback loop 8, shown schematically in FIG. 1, comprises a metal or dielectric wave guide. The wave guide is so dimensioned that radiation of a selected frequency or wave length will be coupled and fed from the output region adjacent opening 10 to the input region adjacent opening 12. The feedback loop should be equipped with means for shifting the phase of the feedback wave. This will facilitate proper phasing of the entire system so that the device may act as a resonator. A standard microwave phase shifter, known in the art, is suitable for this purpose. The coherence and amplitude of the output of the device at the selected frequency is thus greatly increased.

As previously noted, a dielectric slab having a given thickness d will allow propagation of electromagnetic radiation having at least a minimum frequency or a maximum wavelength. The minimum frequency/maximum wavelength radiation is the dominant mode, the higher frequency modes generally being much lower in amplitude. As an example, for an electron beam energy of 100 keV, a slab of dielectric constant 10, and a slab thickness d of 86.5 microns, the dominant mode will have a wavelength of 1000 microns (0.1 centimeters). The wavelength, in microns, of the next four higher modes are 309, 183, 130, and 100, respectively.

Table 1 shows the expected output of a device as disclosed having a slab of dielectric material having a dielectric constant $\epsilon = 6$. For each level of the electron beam energy E, the slab thickness d is chosen so that the dominant mode $\lambda = 1000$ microns in wavelength (0.1 centimeters). The wavelengths of the next four higher modes ae also given in microns.

| E(keV) | d(μ) | $\lambda_1(\mu)$ | $\lambda_2(\mu)$ | $\lambda_3(\mu)$ | $\lambda_4(\mu)$ |
|---|---|---|---|---|---|
| 100 | 136 | 307 | 182 | 129 | 99.9 |
| 120 | 123 | 302 | 178 | 126 | 97.8 |
| 140 | 115 | 298 | 175 | 124 | 95.9 |
| 160 | 109 | 294 | 172 | 122 | 94.2 |
| 180 | 105 | 290 | 170 | 120 | 92.7 |
| 200 | 101 | 286 | 167 | 118 | 91.2 |
| 220 | 98.2 | 283 | 165 | 116 | 89.8 |
| 240 | 95.5 | 280 | 163 | 115 | 88.5 |
| 260 | 93.2 | 277 | 161 | 113 | 87.3 |
| 280 | 91.0 | 274 | 159 | 112 | 86.1 |
| 300 | 89.1 | 271 | 157 | 110 | 84.9 |

Table 1. Thickness of dielectric slab and wavelength, $\lambda_n$, for $0 < n \leqq 4$ and $\epsilon = 6$. The slab thickness, d, is chosen so that $\lambda_o = 0.1$ cm (1000μ) at each value of the energy.

Figure 2:
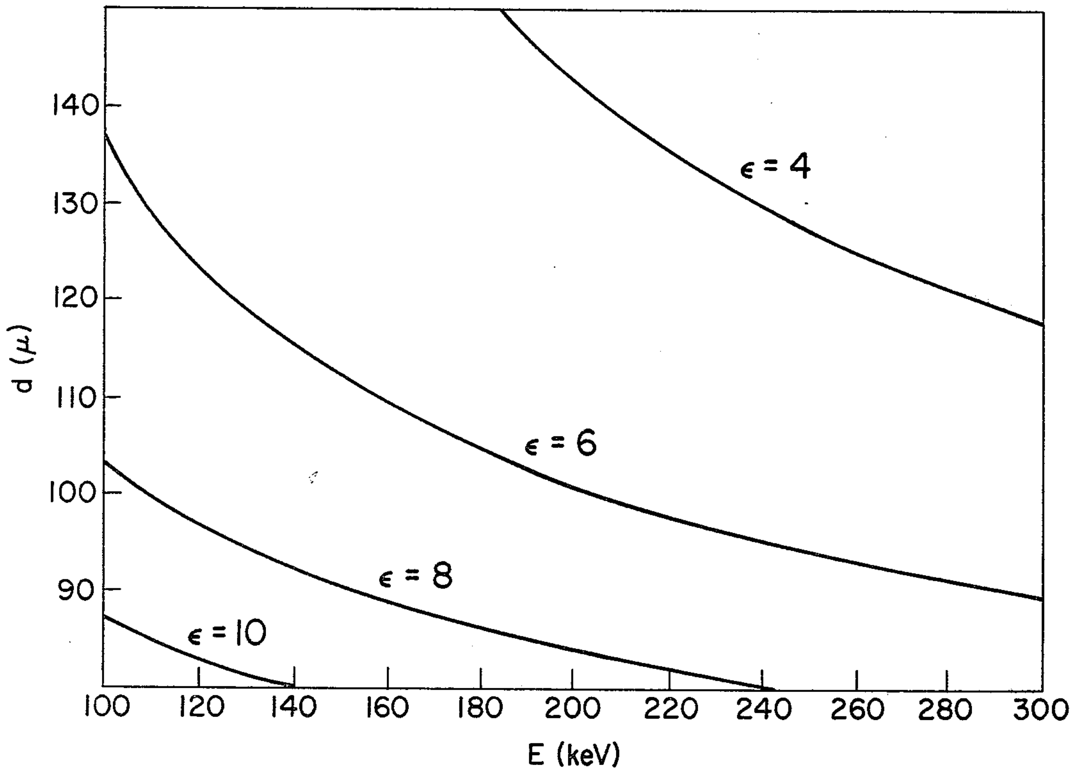
FIG. 2 graphically illustrates the relationship between the thickness of the dielectric body and the energy of the electron beam for a given wavelength of output and various dielectric constants.

The thickness of the dielectric slab which will yield a dominant mode having a wavelength of 0.1 centimeters, as a function of electron energy, is plotted in the graph of FIG. 2 for several values of dielectric constant. As can be seen, the wavelength of the output is less sensitive to electron energy at higher energy levels for a given thickness d.

Various other geometries, in addition to that shown in FIG. 1, may be utilized. The device of the invention may be formed as a hollow cylinder of dielectric material having a metallic cladding on the outside of the cylinder. The electron beam may be directed through the hole in the center of the cylinder. The apparatus of the invention provides an intense coherent source of electromagnetic waves at near-millimeter wavelengths in a very reliable and inexpensive fashion. While the invention has been disclosed with reference to preferred embodiments, it should be understood that we do not desired to be limited to the details herein disclosed, as obvious modifications may be made by those skilled in the art.

We claim:

1. A Cerenkov electromagnetic wave oscillator, comprising a slab of dielectric material having a first substantially smooth surface, a metallic cladding on a second opposed surface of said slab, means to pass an electron beam adjacent said first surface of said slab from a position generally adjacent an input portion of said wave oscillator to a position generally adjacent an output portion thereof, and feedback means for selectively amplifying a chosen mode of radiation emitted from said oscillator.

2. A wave oscillator as in claim 1 wherein said feedback means comprises a feedback loop for removing some energy of said chosen mode from the output portion of the oscillator and feeding said energy back to the input portion of the oscillator.

3. Apparatus as in claim 1 or 2, wherein said feedback means comprises phase shifting means.

4. Apparatus as in claim 2, wherein said feedback means comprises waveguide means for passing said chosen mode of radiation.

* * * * *